United States Patent
Heinz et al.

(10) Patent No.: US 6,495,946 B1
(45) Date of Patent: Dec. 17, 2002

(54) PIEZOELECTRIC ACTUATOR FOR POSITIONING WITH HEAT DISSIPATING INACTIVE END SECTION

(75) Inventors: Rudolf Heinz, Renningen (DE); Bertram Sugg, Gerlingen (DE); Friedrich Boecking, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/762,462

(22) PCT Filed: May 30, 2000

(86) PCT No.: PCT/DE00/01747
§ 371 (c)(1),
(2), (4) Date: Feb. 7, 2001

(87) PCT Pub. No.: WO00/79613
PCT Pub. Date: Dec. 28, 2000

(30) Foreign Application Priority Data

Jun. 19, 1999 (DE) .......................... 198 28 176

(51) Int. Cl.[7] .................... H01L 41/04; H01L 41/08; H01L 41/18; H02N 2/00
(52) U.S. Cl. .................... 310/328; 310/348; 310/366
(58) Field of Search .................. 310/300–371

(56) References Cited

U.S. PATENT DOCUMENTS

| | | | | |
|---|---|---|---|---|
| 4,166,967 A | * | 9/1979 | Benes et al. ............... 310/338 |
| 4,633,120 A | * | 12/1986 | Sato et al. .................. 310/328 |
| 4,780,639 A | * | 10/1988 | Shirasu ...................... 310/328 |
| 4,803,763 A | * | 2/1989 | Eturo et al. ................ 29/25.35 |
| 4,845,399 A | * | 7/1989 | Yasuda et al. ............. 310/366 |
| 5,089,739 A | * | 2/1992 | Takahashi et al. ......... 310/328 |
| 5,237,239 A | * | 8/1993 | Inoue et al. ................ 310/328 |
| 5,266,862 A | * | 11/1993 | Ohya .......................... 310/328 |
| 5,438,232 A | * | 8/1995 | Inoue et al. ................ 310/328 |
| 5,629,906 A | * | 5/1997 | Sudol et al. ................ 367/162 |
| 5,644,184 A | * | 7/1997 | Kucherov ................... 310/306 |
| 5,847,490 A | * | 12/1998 | Kumasaka et al. ......... 310/348 |
| 6,131,256 A | * | 10/2000 | Dydyk et al. .............. 29/25.35 |
| 6,262,518 B1 | * | 7/2001 | Ishikawa et al. ........... 310/355 |
| 6,266,857 B1 | * | 7/2001 | Corbett, III et al. ....... 29/25.35 |
| 6,291,929 B1 | * | 9/2001 | Heinz et al. ................ 310/328 |
| 6,310,422 B1 | * | 10/2001 | Satoh et al. ............ 310/313 R |
| 6,333,587 B1 | * | 12/2001 | Heinz et al. ................ 310/328 |
| 6,392,327 B1 | * | 5/2002 | Lewis et al. ............ 310/316.01 |

FOREIGN PATENT DOCUMENTS

| | | | |
|---|---|---|---|
| JP | 02017873 A | * | 1/1990 |
| JP | 02017875 A | * | 1/1990 |
| JP | 02083424 A | * | 3/1990 |
| JP | 02083425 A | * | 3/1990 |
| JP | 03020673 A | * | 1/1991 |
| JP | 05335875 A | * | 12/1993 |

OTHER PUBLICATIONS

Patent Abstract of Japan vol. 1995, No. 07, Aug. 31, 1995 & JP 07 099347 A, Apr. 11, 1995.

* cited by examiner

*Primary Examiner*—Nestor Ramirez
*Assistant Examiner*—Pedro J. Cuevas
(74) *Attorney, Agent, or Firm*—Michael J. Striker

(57) ABSTRACT

A piezoelectric actuator is described, for example for actuating a mechanical component, in which a piezoelectric element that produces tensile or compressive force acting on an actuation element is provided. The piezoelectric element has a multi-layer structure of piezoelectric layers with internal electrodes (2, 3) disposed between them. The contacting of the internal electrodes (2, 3) on alternate sides takes place by means of external electrodes (10, 11). External electrical connections (12) for the lateral contacting are affixed to an inactive end region (4, 5, 6, 7; 13, 14) in the multi-layer structure, which has a heat-conducting core (5; 14) with a favorable heat conductivity.

4 Claims, 1 Drawing Sheet

US 6,495,946 B1

PIEZOELECTRIC ACTUATOR FOR POSITIONING WITH HEAT DISSIPATING INACTIVE END SECTION

BACKGROUND OF THE INVENTION

The invention relates to a piezoelectric actuator, for example for actuating a mechanical component, such as a valve or the like, comprising a piezoelectric element, which is provided with a multi-layer structure of piezoelectric layers with internal electrodes disposed between them and with external electrodes making electrical contact with the internal electrodes on alternate sides.

It is generally known that a piezoelectric element operating according to the piezoelectric effect can be constructed out of a material with a suitable crystalline structure. The application of an external electrical voltage causes a mechanical reaction of the piezoelectric element which, depending on the crystalline structure and the region to which the electrical voltage is applied, produces a compression or tension in a predictable direction.

The piezoelectric actuators mentioned above are frequently used in valve positioning. Among other things, their stroke capacity for actuating a valve tappet, for example, is relatively small and thermal expansion of the ceramic of the piezoelectric element can lead to a drift in the position of the valve tappet when the piezoelectric element is not triggered. Also, contact with the active parts of the piezoelectric actuator is difficult.

SUMMARY OF THE INVENTION

It is an object of the present invention to provide a piezoelectric actuator, which does not suffer from the above-described disadvantages.

The piezoelectric actuator described at the beginning, which can be used, for example, to actuate a mechanical component, advantageously has a piezoelectric element that generates a tensile or compressive force acting on an actuation element, which is provided with a multi-layer structure of piezoelectric layers with internal electrodes disposed between them and with external electrodes contacting the internal electrodes on alternate sides of the piezoelectric element.

In this connection, it is particularly advantageous that the external electrical connections for the lateral contacting are affixed to an inactive end region in the layer structure and the end region has a core with favorable heat conductivity. As a result, the external contacting of the piezoelectric actuator in inactive end regions that are not affected by tensile or compressive forces, which contacting must be reliably produced, can be easily combined with favorable heat dissipation in order to avoid the disadvantages described at the beginning.

In one advantageous embodiment, the inactive end region has a relatively thin, electrically insulating cover layer on the layer structure. The cover layer is provided with a heat-conducting core which in turn has electrically insulating ceramic layers affixed to its sides. The connection between the external electrodes and the external electrical connections can thereby be produced in the ceramic layers. Preferably this can be achieved by means of a solder layer which is applied to the respective ceramic layer in the vicinity of the external electrodes. In another likewise very advantageous embodiment, the inactive end region comprises an electrically insulating ceramic part in which the connection between the external electrodes and the external electrical connections can be produced at the sides. In this embodiment, a heat-conducting core is embedded in the ceramic layer. In a particularly preferable way, in the plane of the layers, the core has a round contour and is consequently disk-shaped on the whole.

These and other features of preferred improvements of the invention ensue from the claims, the specification, and the drawings, wherein the individual features can be realized singly or multiply in the form of sub-combinations in the various embodiments of the invention and in other areas and can represent advantageous and intrinsically patentable embodiments which are claimed herein.

BRIEF DESCRIPTION OF THE SEVERAL VIEWS OF THE DRAWINGS

Exemplary embodiments of the piezoelectric actuator according to the invention, for example for positioning a valve, will be explained in detail in the following detailed description in connection with the drawings, in which.

DETAILED DESCRIPTION OF THE INVENTION

Figure 1:
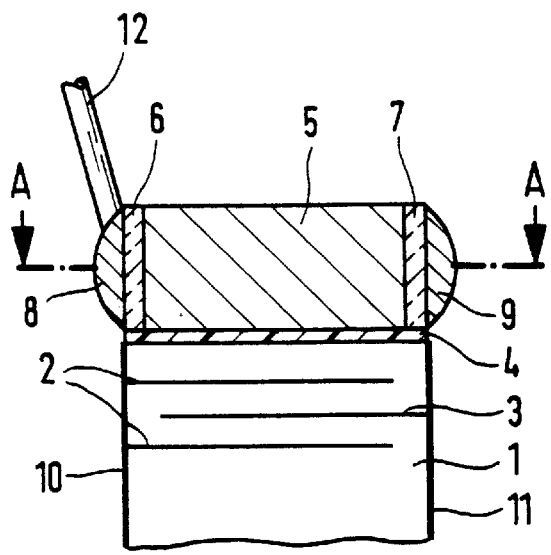
FIG. 1 is a sectional view through a first exemplary embodiment of a piezoelectric actuator according to the invention with a contactable inactive end region which is comprised of a thin cover layer and a heat conducting core disposed on it.

FIG. 1 shows a piezoelectric actuator 1, which is constructed in an intrinsically known manner from piezoelectric foils of a ceramic material with a suitable crystalline structure. The application of an external electrical voltage to internal electrodes 2 and 3 produces a mechanical reaction of the piezoelectric actuator 1 due to the so-called piezoelectric effect. In the exemplary embodiment according to FIG. 1, the end of the layer structure of the piezoelectric actuator 1 has a thin inactive cover layer 4 affixed to it, which is part of an inactive end region and produces an electrical insulation of the end region in relation to the layer structure. The cover layer 4 has a favorably heat conducting core 5 disposed on it, which can dissipate the heat from the piezoelectric actuator 1 toward the outside.

The side surfaces of the core 5 can have likewise inactive, electrically insulating ceramic cover layers 6 and 7 affixed to them, which can each be provided with a solder layer 8 and 9. This disposition can also be inferred particularly from the section along line A—A in FIG. 2.

The internal electrodes 2 and 3 are contacted by flat external electrodes 10 and 11 which are respectively connected to the solder layers 8 and 9. The solder layers 8 and 9 can in turn have external connections (a connecting wire 12 is shown here) affixed to them by means of which the piezoelectric actuator 1 can be supplied with an electrical voltage.

Figure 2:
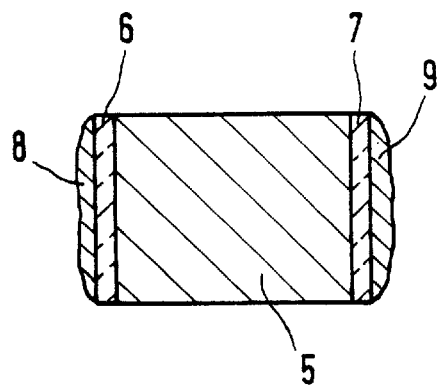
FIG. 2 is a transverse sectional view of the end region along the line A—A in FIG. 1.
Figure 3:
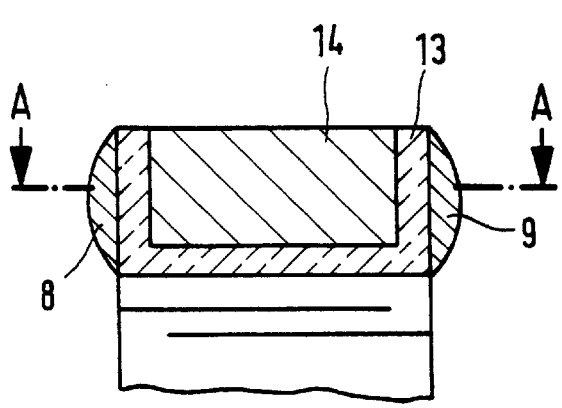
FIG. 3 is a sectional view through a piezoelectric actuator according to a second exemplary embodiment, with a contactable Inactive end region made of ceramic in which a disk-shaped, heat conducting core is embedded.

In a second exemplary embodiment from FIG. 3, the end of the layer structure of the piezoelectric actuator 1 has a one-piece ceramic part 13 affixed to it, which is part of the inactive end region and produces the electrical insulation of the end region in relation to the layer structure. The one-piece ceramic part 13 has a favorably heat conductive, disk-shaped core 14 embedded in it, via which the heat from the piezoelectric actuator 1 can be dissipated toward the outside in the same way as in the exemplary embodiment according to FIGS. 1 and 2.

Figure 4:
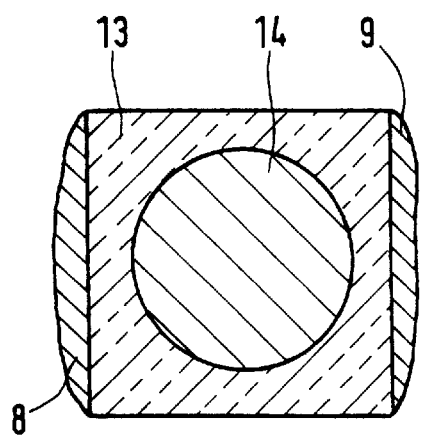
FIG. 4 is a transverse sectional view of the end region along the line A—A in FIG. 3.

The side surfaces of the ceramic part 13 here have the solder layers 8 and 9 affixed to them in a comparable way to that of the exemplary embodiment according to FIGS. 1 and 2. This arrangement can be inferred as well here particularly from the section along the line A—A in FIG. 4, wherein the round contour of the core 14 is visible.

What is claimed is:

1. A piezoelectric actuator for positioning a mechanical part, said piezoelectric actuator comprising a piezoelectric element for generating tensile or compressive force acting on an actuation element, said piezoelectric element including a multi-layer structure of piezoelectric layers with internal electrodes (2, 3) disposed between said piezoelectric layers, external electrodes (10, 11) making electrical contact with the internal electrodes on alternate sides and an inactive end region, said end region comprising a heat-conducting core (5) having heat dissipation properties for avoiding thermal expansion of said piezoelectric element; and external electrical connections (12) for lateral electrical contact affixed to said inactive end region;

wherein said inactive end region comprises an electrically insulating cover layer (4) affixed to the multi-layer structure, said heat-conducting core (5) affixed to said cover layer (4) and electrically insulating ceramic layers (6, 7) affixed to sides of the heating-conducting core (5), and wherein means for electrical connection of the external electrodes (10, 11) and the external electrical connections (12) are provided on the ceramic layers (6, 7) of the end region.

2. A piezoelectric actuator for positioning a mechanical part, said piezoelectric actuator comprising a piezoelectric element for generating tensile or compressive force acting on an actuation element, said piezoelectric element including a multi-layer structure of piezoelectric layers with internal electrodes (2, 3) disposed between said piezoelectric layers, external electrodes (10, 11) making electrical contact with the internal electrodes on alternate sides and an inactive end region, said end region comprising a heat-conducting core (14) having heat dissipation properties for avoiding thermal expansion of said piezoelectric element; and external electrical connections (12) for lateral electrical contact affixed to said inactive end region;

wherein the inactive end region comprises an electrically insulating ceramic part (13) and said heat-conducting core (14) embedded in said ceramic part (13), and wherein means for electrical connection of said external electrodes (10, 11) and said external electrical connections (12) are provided on sides of said ceramic part (13) of the inactive end region.

3. The piezoelectric actuator according to claim 2, wherein said heat-conducting core has a round contour in transverse planes parallel to the internal electrodes or layers of the multi-layer structure.

4. The piezoelectric actuator according to claim 1 or 2, wherein said means for electrical connection of said external electrodes (10, 11) and said external electrical connections (12) comprise a solder layer (8, 9) on sides of said inactive end region.

* * * * *